United States Patent Office 3,758,304
Patented Sept. 11, 1973

3,758,304

METHOD OF PRODUCING ELECTRICALLY CONDUCTIVE METAL LAYERS

Casper Johannes Gerardus Ferdinand Janssen, Hendrik Jonker, Lambertus Postma, and Angustinus Joseph Geurts, Emmasingel, Netherlands, assignors to U.S. Philips Corporation, New York, N.Y.

No Drawing. Filed Feb. 8, 1971, Ser. No. 113,664
Claims priority, application Netherlands, Feb. 10, 1970, 7001820
Int. Cl. G03c 5/00, 11/00, 5/24
U.S. Cl. 96—38.4 11 Claims

ABSTRACT OF THE DISCLOSURE

Method of manufacturing conductive metal patterns on a preferably insulating substrate with the aid of a curable, light-sensitive adhesive layer containing a semiconductor, light-sensitive oxide such as $TiO_2$. Prior to exposure the layer is partly cured and then superficially chemically roughened lightly. After exposure metal nuclei are formed by the contact with a metal salt solution, metal being subsequently deposited on said nuclei.

The invention relates to a photochemical method of metallizing synthetic resins uniformly or according to a pattern by and particularly to additive methods of manufacturing electrically conductive metal patterns on insulating synthetic resin layers, such as printed wirings and to the products obtained by said methods.

The term "additive method of manufacturing printed wirings" is to denote that type of method in which the metal pattern is predominantly directly built up on an unclad synthetic resin layer. This type of method differs from the subtractive method in which the basic material is formed by a synthetic resin support clad with a metal layer, from which the metal located outside the desired pattern is etched away after the metal parts corresponding with the pattern have been covered by a layer resistant to the etchant to be employed.

Additive methods may be divided into semiadditive and fully additive methods. In a semi-additive method the unclad synthetic resin layer is rendered conductive, subsequent to the deposition of a thin adhesive layer, by deposting a thin metal layer by means of the electroless metallizing method. Then in accordance with the negative of the desired pattern a resistant mask is applied, after which the exposed portions are grown up to the desired thickness by electrodeposition. Finally the mask and the subjacent thin metal layer are removed. In a fully additive method the synthetic resin layer coated with an adhesive layer is provided solely at the areas corresponding with the pattern with a thin, conductive metal layer, which is grown up to the desired thickness either by electrodeposition or preferably by selective electroless metallizing.

A fully additive photochemical method of metalizing synthetic resins is described in British patent application 44,513/68 (U.S.A. application Ser. No. 760,711 now U.S. Pat. 3,674,485). In this case the support material may be an insulating or non-insulating support provided with a light-sensitive adhesive layer consisting of an insulating, predominantly hydrophobe, resinous binder in which finely divided particles of a light-sensitive, semiconductive metal oxide, particularly $TiO_2$ or ZnO, are homogeneously dispersed. This light-sensitive, semiconductive oxide is capable by exposure to light of separating copper and/or a metal nobler than copper from a solution of the metal salt concerned. Subsequent to and/or after exposure the layer is treated with such a solution. After metal nuclei are formed during and/or after the exposure at the exposed areas and after, if necessary, the excess of metal salt is removed, the layer of metal nuclei is intensified with the aid of a stabilized physical developer or with the aid of an electroless copper-, nickel- and/or cobalt-plating bath to form an electrically conductive metal layer, on which subsequently, if desired further metal layers are deposited by electrodeposition.

The hydrophobic resin constituents in the solution in which the light-sensitive compounds are dispersed in a finely divided state, for example by means of a ball mill, consist, particularly when they are applied as an adhesive medium on a support, preferably of a combination of a thermohardening compound and a slightly elastic, adhesive compound uniformly distributed therein.

The support materials on which the light-sensitive layer is adhered, are inter alia synthetic resin laminates, consisting of phenol resin, epoxy resin or polyester resin impregnated paper, cotton tissue or glass fibre tissue, synthetic resin foils consisting of polyester, polyimide or polytetrafluoroethylene, but also glass, ceramic material, glass ceramic, metal foil or metal sheet.

It will be obvious that if an optimum adhesion of a light-sensitive adhesive layer to the support layer is aimed at the distribution of the light-sensitive substance in the resin composition has to be such that at the interface between the light-sensitive layer and the support material the adhesive binder instead of the semiconductive metal oxide is in contact with the basic material. This means that the ratio between the constituents of the light-sensitive layer is such that the discrete particles of the semiconducive metal oxide are completely enveloped by a sheath of the hypdrophoblic binder. On the side of the light-sensitive layer accessible to the processing liquids the situation is then such that the metal oxide particles are practically completely screened from the solution of the metal salt which has to provide by the reaction with the light-activated particles the metal nuclei and also from the solution by means of which the metal germs are intensified to the final conductive metal layer. Consequently, if a composition of the light-sensitive dispersion is chosen to be at the optimum for adhesion to the support layer, the formation of metal nuclei on the light-sensitive layer is highly inhibited.

The object of the invention is to provide a method of producing electrically conductive metal layers with an optimum adhesion to the insulating adhesive layer, said layers containing a light-sensitive, semiconductive metal oxide, while this adhesive layer also has an optimum adhesion to the support layer, while at the same time the light-sensitive semiconductive metal oxide particles exhibit maximum accessibility at the surface for the processing liquids.

A further object of the invention is to provide a simplified method of the (semi)-additive type for the manufacture of printed wirings, with which, if desired, printed resistors may be integrated, which are capable of withstanding the thermal shock in dip soldering without being adversely affected and without forming bubbles.

A still further object of the invention is to provide a novel method of the (semi)-additive type for the manufacture of printed wirings with plated-through holes, the metal being deposited on the conductor paths and on the walls of the holes in the same steps of the process.

In a method known from the United Kingdom Pat. 1,187,061 the thermo-hardening adhesive layer applied to a basic material and containing a rubber-like constituent is almost completely cured, as a rule, prior to the application of the pattern by means of an additive method. Then the substantially cured adhesive layer is exposed, at least in the portions to be metallized, to the vigorous attack of an oxidizing agent, which affects the rubber constituent so that pores are formed across the whole adhesive layer, which pores have to anchor the metal pattern in the adhesive layer.

In a further known method, in which adhesive layers are used which consist of thermohardening constituents and rubber-like constituents in a ratio of weight lying between 4:1 and 1:4, the adhesive layer is first subjected to a first curing treatment for 1 to ½ hour at a temperature between 125° C. and 165° C. Then the layer is mechanically and/or chemically roughened also vigorously, and after the chemical deposition of a thin metal layer (1 to 5 $\mu$m.) and if desired by electrodeposition, the curing treatment is repeated, for example, for 1 to ½ hour at 140° to 160° C., after which the intensification with metal to the final thickness is achieved.

The experiments leading to the invention have shown that the first thermal treatment of the adhesive layer containing a dispersed light-sensitive, semi-conductive metal oxide, to which the method embodying the invention relates, may be considerably shorter than in said known methods and that if the second thermal treatment of the last-mentioned known method is performed after the metal has been built up, instead of being carried out after the application of the thin metal layer, no difficulty arises in dip soldering. Apparently the finely divided metal oxide in the adhesive layer counteracts the formation of bubbles in the metal layer during soldering.

Moreover, in the adhesive layers in which a light-sensitive, semiconductive metal oxide is dispersed, a gentle, superficial attack on the adhesive layer will suffice, probably also due to the comparatively mild first thermal treatment, so that apparently only the oxide particles located at the surface are partly uncovered. At any rate this attack has not shown to give rise to the formation of pores across the whole adhesive layer so that the roughening treatment serves in the first place to provide optimum accessibility of the light-sensitive metal oxide particles at the surface for the liquids employed.

If the adhesive layers used in the method embodying the invention are more vigorously attacked, the cohesion in the adhesive layer and hence the adhesion of the metal layer to the adhesive layer is drastically reduced.

The method according to the invention is characterized in that the binder of the layer containing the light-sensitive compound consists of thermo-hardening constituents and rubber-like constituents in a weight ratio lying between 4:1 and 1:4, that in the dried state this layer has a thickness between about 5 and 20 $\mu$m. and that the binder contains a light-sensitive metal oxide in a ratio between about 8:1 and 1:4 and in that prior to exposure the layer is subjected to a thermal treatment during 2 to 15 minutes at a temperature between 130° C. and 200° C., after which the binder is superficially affected in a controlled manner by a known chemical roughening solution, the composition, the time of attack and the temperature of attack of which are mutually adjusted so that a thickness between about 0.1 $\mu$m. and 1 $\mu$m. is etched away from the layer.

The semiconductor metal oxides preferably employed as a light-sensitive substance are $TiO_2$, or ZnO. Other suitable oxides are, for example, $SnO_2$ and $SiO_2$.

The term "light-sensitive" has to be understood in the scope of this invention in the wide sense of a sensitivity for electromagnetic radiation (visible, ultraviolet, X-rays) and for electron radiation. In general, commercially available semiconductor metal oxides of a particle size between about 0.03 and 0.5 $\mu$m. are used.

The chemical roughening solution for the required superficial attack is preferably a solution of chromic acid bichromate)-sulphuric acid, which may contain phosphoric acid, in addition. Such solutions are known as etchants for thermoplastic synthetic resins in the metallizing process (H. Narcus, Metallizing of Plastics, New York, 1960, page 17) and particularly for so-called ABS substances (Metal Finishing, November 1964, pages 52 to 56, 59). The time of attack is 10 to 30 minutes at a temperature of 50° C. to 80° C. (Galvanotechnik 59, 32 to 36 (1968), ibid. 57, 698 to 700 (1966)). It furthermore appears that only 60 to 80 sq. dms. of synthetic resin per litre of roughening solution can be roughened. This is understandable if it is considered that in accordance with recent investigations (Galvanotechnik, 56, 651 (1956)) the rubber-like constituent of the synthetic resins is decomposed by oxidation so that cavities are formed over a given depth in the layer, so that the metal deposit is anchored in the layer. As stated above, the method embodying the invention only aims at rendering the metal oxide particles lying at the surface accessible (uncovering) for the liquids to be used so that a considerably shorter duration of attack at a much lower temperature will suffice, whilst considerably more than 1000 sq. dms. of light-sensitive adhesive layer per litre of roughening solution can be treated, which will be described in the examples.

By the method embodying the invention, in conjunction with the known method, synthetic resins can be uniformly metallized throughout the surface in various ways or be provided with electrically conductive metal patterns.

The layer containing the light-sensitive, semiconductive metal oxide, subsequent to the superficial action of the chemical roughening solution, may first be treated with a solution containing Pd(II)- or Pt(II)-ions in a concentration of 0.0005 to 0.25% by weight, and be then uniformly exposed, subsequent to drying, after which the metal nuclei formed are intensified to form an uninterrupted, electrically conductive metal layer with the aid of an electroless copper- or nickel-plating bath. If desired, the intensification to an uninterrupted, electrically conductive metal layer, preferably to a thickness between 1 and 5 $\mu$m. may be partly carried out by electrodeposition. A product of superior quality is obtained, when the metal nuclei are intensified by flexible copper with the aid of an electroless copper-plating bath disclosed in the not yet published British patent application 48,590/70 in the name of the applicant.

Such an alkaline, aqueous, electroless copper-plating bath free of an inorganic cyanide, an organic nitrile or a compound of the elements Mo, Nb, W, Re, V, As, Sb, Bi, Ac, La and rare earth metals, contains as essential constituents the following substances:

0.01 to 0.1 mol of a water-soluble copper salt, in total, 0.01 to 0.8 mol of one or more complex forming compounds, which prevent cupric ions from being precipitated from the alkaline solution;

0.05 to 0.50 mol of alkaline hydroxide (pH about 11 to 13.5);

0.01 to 0.35 mol of formaldehyde or a compound producing formaldehyde, and in an effective concentration one or more soluble, non-ionic or ionic polyalkylene oxidic compounds, forming or not forming mycells, and containing at least 4 alkylene oxide (alkoxy) groups.

Such a polyalkylene oxidic compound, preferably corresponds to the general formula:

$$R_1(C_2H_4O)_a(C_nH_{2n}O)_b(C_2H_4O)_cR_2$$

wherein $a+b+c\geqslant 4$ and, if $n=0$, 3 or 4, $R_1$ is H and $R_2$ is OH, or $n=0$, $R_1$ is a branched or non-branched alkyl- or alkylaryl-group and at the same time $R_2$ is a hydroxyl group, a sulphate group or a multiple-esterified or non-esterified phosphate group or, if $n=0$, $R_1$ is H and at the same time $R_2$ is an alkylamine or a fatty acid-amide-group or a branched or non-branched alkyl-substituted mercapto-group.

On the basis of a basic layer provided with a uniform metal layer in the manner described above, printed wirings can be made by semi-additive methods by providing the metal layer with a resist layer in accordance with the negative of the desired wiring pattern, after which the uncoated parts are intensified to the desired thickness by electrodeposition, after which the mask and the subjacent thin metal layer are removed.

Plated-through holes may be made in the sheets provided on both sides with printed wirings by punching or drilling the holes prior to or after the application of the resist layers in negative and by sensitizing the walls of the holes in a known way by electroless metal deposition.

The walls of the holes may be sensitized by treating them in order of succession, with intermittent washing, with an acidic solution of stannous ions in water ("sensitization") and by an acidic solution of noble metal ions, for example, palladium(II)-ions in water ("activating"). The sensitization is preferably carried out by means of a solution in water containing a mixture of stannous ions and palladium(II)-ions, the stannous ions being provided in excess.

As compared with known semi-additive and additive methods the methods embodying the invention have the advantage that the adhesive layer, which may be applied to both sides of the support, can be sensitized by the action of light, so that no treatment with, for example, a solution of stannous ions in water, need be carried out. Sensitization for electroless metallization may then be confined to an "activating" treatment, preferably prior to, but, if desired, subsequent to the exposure, for example, with the aid of a solution of palladium(II)-ions in water. This implies, in addition, that by geometric demarcation of the action of light the sensitization may be directly in accordance with the pattern.

Said advantage may be further enhanced for the production of printed wirings with metal plated-through holes in accordance with the invention by applying the adhesive layer containing the light-sensitive semiconductor metal oxide to both sides of a synthetic resin substrate, containing as a filler uniformly dispersed fine particles of a light-sensitive, semiconductor metal oxide or being uniformly sensitized and/or activated right across for electroless metallization.

In the first-mentioned case the sensitization in the holes has to be obtained again by the action of light, which may give rise to difficulties according as the ratio between the diameter and the length of a hole is lower. These difficulties may be obviated by using as a filler already activated, finely dispersed particles of a light-sensitive, semiconductor metal oxide. It is, for example, possible to saturate adsorptively an aqueous suspension of the metal oxide by treating it with a solution of palladium(II)-ions in water, to filter off the suspension, to expose it to light in the semi-wet state, to dry and to use it in a powdery state as a filter in the manufacture of the basic material, for example, hard paper or epoxy glass plate. If holes are made in the basic material, metal oxide particles provided with palladium nuclei are exposed so that metal can be deposited by the electroless method on the walls without the need for further means.

It is, however, most interesting to use a sensitized synthetic resin substrate. For this purpose compounds capable of separating the metal from copper ions and/or ions of a metal nobler than copper may be homogeneously distributed in the resin composition used for the manufacture of the synthetic resin substrate. Suitable compounds are, for example, ferrous, stannous-, titanium(III)-, vanadium(II)-chromium(II)-compounds and dithionites, hypophosphites, boranes and borazanes, preferably added in a dissolved state.

Very appropriate compounds are also the so-called redox polymers or redoxities. They comprise a covalent redox system and are chemically unsoluble in a macromolecular matrix, in which they are incorporated or to which they are attached. Such compounds may be sensitized by polymerisation (a), condensation (b) or by subsequent attachment of a redox system to a polymer matrix (c). Examples of (a) are redox polymers on the basis of vinylhydroquinone, vinylcatechol, vinylnaphthohydroquinone, vinylanthraquinone, vinylferrocene and vinylphenothiazine. Examples of (b) are hydroquinone/formaldehyde-, pyrocatechol/formaldehyde-, pyrogallol/formaldehyde- and naphthazarine/formaldehyde-polycondensates, as well as mixed condensates of hydroquinone, phenol and formaldehyde, of juglone, phenol and formaldehyde, or of 2-hydroanthraquinone, phenol and formaldehyde and of resorcinol, methylene blue and formaldehyde. Method (c) starts from a macromolecular substance having reactive groups. It is, for example, possible to bind chemically quinone, methylene blue, thionine and ferrocene to a three-dimensionally transverse-bonded polyaminostyrene. Furthermore hydroquinone, substituted hydroquinone, pyrogallol or anthraquinone may be reacted with macroreticular poly(vinylbenzyl)chloride copolymers. They have an appreciable pore volume and characteristic distributions of pore diameters, which is important for the use. Moreover, starting from natural and synthetic polymers containing OH-groups, such as cellulose and polyvinylalcohol, redox polymers may be formed by copolycondensation with formaldehyde and, for example, hydroquinone, pyrocatechol and pyrogallol. A survey of the syntheses and the properties of redox polymers is given by H. G. Cassidy and K. A. Kun in Oxidation-Reduction Polymers (Redox Polymers), New York, London, Sydney, 1965.

Redox resins are uniformly distributed in an active quantity in the resin composition used for the manufacture of a synthetic substrate. The redox system may previously be transferred, if necessary, for example by means of a solution of sodium dithionite into the redform. If holes are made in the substrate, the exposed reducing groups will reduce the metal ions of an appropriate activating solution to metal nuclei, which catalyse the electroless deposition of metal. It is important to use finely porous redox polymers because the deposited metal will stick in the pores.

The substrate sensitizing method most suitable is that in which commercially available ion exchangers are used, to which a suitable redox system in the ionogenic form is bound adsorptively. Cationic redox groups are bound to an acidic cation exchanger, whereas anionic redox groups are bound to an alkaline anion exchanger. In this way the active redox groups can be adsorptively concentrated on the ion exchanger, which has a favourable effect in electroless metallization of the walls of holes.

Ion exchangers may be divided on the one hand into natural and synthetic exchangers and on the other hand into inorganic and organic exchangers. Inorganic ion exchangers are the natural clay and zeolith minerals. At present also synthetic zeolites are employed. In general, in conjunction with redox systems they are not the most suitable substances for the sensitization of synthetic resin substrates. More important are the inorganic ion exchangers produced by the reaction of zirconium oxychloride with sodium molybdate, tungstate or phosphate in a weak acidic solution. The resulting gel structure is a network of zirconium atoms and molybdate, tungstenate or phosphate groups bound by oxygen atoms. The $H^+$-ion of the hydroxyl groups at the zirconium atoms can be exchanged against other cations, such as the hydrazinium-, the hydroxyl-ammonium- and the ferrous ion. Suitable products are, for example, Bio-Rad ZP–1, Bio-Rad ZM–1 and Bio-Rad ZT–1 of Bio-Rad Laboratories. On the other hand the zirconoxyhydrategel (Bio-Rad HZO–1) may be used after being charged with reducing anions, such as the dithionite-, hypophosphite- and boranate-ion.

Important are furthermore the organic ion exchangers on the basis of the natural cellulose. Reference may be made to diethylamino-ethylcellulose (DEAE-cellulose) and triethylaminoethylammoniumcellulose (TEAE-cellulose) as anion exchangers and phosphate cellulose (P-cellulose) and sulphomethylcellulose (SM-cellulose) as cation exchangers. These products are commercially available.

Still more important are the ion exchangers formed by synthetic resins. One of the oldest products is a phenol/formaldehyde/sodium sulphite condensate. There is furthermore known a condensation product of sulphonated phenol with formaldehyde. Modern cation-exchanging resins are obtained by sulphonating a styrene-divinylbenzene copolymer. By the choice of the quantity of divinylbenzene the degree of transverse bonding and hence the porosity of the resins may be varied. A cation exchanger containing carboxyl groups is produced by the suspension-copolymerisation of metacrylic acid and divinylbenzene. Anion exchangers of the phenol type may be produced by the condensation of a phenol, formaldehyde and triethylenetetramine. Anion exchangers of the styrene divinylbenzene type may be produced by the introduction of a chloromethyl-group into the benzene ring and amination with trimethylamine. Further details of the ion exchangers can be found with R. Kunin: Elements of Ion-Exchange, New York/London, 1960.

Acidic cation exchangers suitable for use are, for example, Amberlite IR–120 and Amberlite IRC–50 (Rohm and Haas Company), Dowex–50 (Dow Chemical Company), Duolite C–20 (Chemical Process Company), Lewatit S–100 (Bayer A.G.) and Permutit RS (Permutit A.G.). Suitable basic anion exchangers are Amberlite IRA–400 and Amerblite IR–45 (Rohm and Haas Company), Dowex 1 and Dowex 2 (Dow Chemical Company), Lewatit MN (Bayer A.G.) and Permutit ES (Permutit A.G..

Cation exchangers may be charged to saturation with Fe(II); Sn(II); Ti(III); V(II) or Cr(II)-ions. If desired, the charge may be carried out with the ions in the oxy-form and the adsorbed ions may be reduced by a vigourous reducing agent. Moreover, redox indicators such as thionine, methylene blue, diazine green, phenosaffranine, saffranine T, neutral red, benzylviologene or methylviologene may be adsorbed to saturation at the acidic ion exchangers, after which the colour substance cations are changed by reduction into the red-form.

Anion exchangers, on the contrary, may be charged by reducing anions such as stannite, hypophosphite, dithionite, aminoiminomethanesulphinate or boranate or else with hydroquinone (sulphonate), anthreahydroquinonesulphonate or hydroindigosulphonate. If necessary, the anions may be changed over in the adsorbed state into the red-form. A strongly alkaline anion exchanger charged with indigodisulphonate is commercially available under the trade name of Serdoxit (Serva Entwicklungslabor). The adsorption of the colouring substance is quite irreversible. By a treatment with a solution of sodium dithionite the dye is changed over to the red-form and in this state the product is absorbed in the synthetic resin substrate.

Reducing metal ions, which form anionic complexes, may also be adsorbed at a basic anion exchanger such as $SnCl_2$ complexed with an excess quantity of chloride ions at Lewatit MN.

The production of a redox ion exchanger is very simple. Hereinafter the production of a reducing ion exchanger by charging Lewatit M–600 or Permutit ES with boranate or dithionite respectively will be described. The ion exchanger available in the $OH^-$ form is charged in a column or by shaking with an adequate excess quantity of a 10% neutral or slightly ammonial solution of the reducing agent and washed with water, if necessary, at the exclusion of air, until the anion concerned is no longer found in 25 mls. of the rinsing water. (No decolouring after the addition of a drop of 0.1 N potassium permanganate solution.) The charged ion-exchanger is fairly resistant in air. The redox capacity of the Permutit ES-dithionite, for example, is substantially unchanged after 24 hours. The boranate-anion exchanger among the known redox ion exchangers is that which has the lowest redox potential and the greatest theoretic reduction capacity. With the reduction of metal ions the reduced metal is withheld in the fine pores of the ion exchanger, which is conducive to a satsifactory adhesion of the metal deposited by the electroless method.

The production of, for example, Dowex–50 Leucomethylene blue is performed as follows. $H^+$-Dowex–50 is shaken to saturation with a 0.01 to 0.1% solution of methylene blue in diluted sulphuric acid (lower than 0.5 N), washed with distilled water and washed in a column to be free of sulphate. The red-form is obtained by treating the coloured ion exchanger at the exclusion of air for a few minutes (up to decolouring) with a slightly ammoniacal 10% solution of sodium dithionite in water:

Finally said sensitizing agents are dispersed in a finely divided state in the organic resin used for impregnating paper, glass fibre or polyester fibre for laminates or used for casting or forming in another way of a support or for the use of thin films of nonpolymerized resin, a plurality of which is laminated to form a substrate.

In an additive method of producing printed wirings with completely metallized holes the layer containing the light-sensitive, semi-conductor metal oxide is applied to both sides of one of the aforesaid synthetic resin substrates. After the light-sensitive layers have been thermally treated in the manner described and have been superficially roughened resist masks according to the negative of the desired patterns are applied thereto. Immediately prior or subsequent thereto the sheet is provided with the required holes. Subsequently the apertured panel is treated with a solution containing Pd(II)- or Pt(II)-ions in a concentration of 0.0005 to 0.25% by weight, after which it is dried and exposed. The walls of the holes and the conductor paths provided with metal nuclei are then coated with a layer of flexible copper of the desired thickness by means of the aforesaid bath, after which, if desired, the resist masks are removed.

In a further additive method of producing electrically conductive metal patterns in accordance with the invention the layer containing the light-sensitive semiconductor metal oxide is provided, subsequent to the thermal treatment, with a resist mask in accordance with the negative of the desired pattern, after which it is subjected to the controlled attack of a chemical roughening bath and, if desired, after the removal of the resist mask, it is treated with a solution containing Pd(II)- or Pt(II)-ions in a concentration between 0.0005 and 0.25% by weight, after which the dried layer is exposed and the Pd-nuclei formed are intensified by means of an electroless copper- or nickel-plating bath to an electrically conductive metal layer.

By means of the method just described, for example, meandering printed resistors may be manufactured by growing them at the exposed layer treated with Pd(II)-ions to a thickness corresponding to a resistance of 0.1 to 150 ohms per square with the aid of an electroless nickel-plating bath depositing nickel with a comparatively high phosphorus content and a comparatively low temperature coefficient of the resistance.

It is known that the phosphorus content and hence the temperature coefficient of the electrical resistance of the deposited nickel layer can be influenced by varying the pH value of the nickel-plating solution and the temperature at which the deposition takes place. This temperature coefficient is the lower, the lower are the pH-value and the temperature of deposition. Suitable temperatures of deposition are between 50° C. and 98° C. and suitable pH-values are between 2.5 and 4.5. (Plating, May 1967, pp. 523–532; U.S. Pat. 3,401,057.) In order to stabilize the resistance value and the value of the temperature coefficient of the resistance with respect to ageing, the layers are heated at about 200° C. for a few hours, which treatment involves in addition subsequent curing of the light-sensitive adhesive layer.

In a manner similar to that described for the manufacture of printed resistors printed wirings can be obtained by growing on the Pd-nuclei conductive paths to the desired thickness with the aid of an electroless copper-plating bath, in which case again the bath defined above is definitely preferred.

Printed wiring panels in which printed resistors are integrated are manufactured by a combination of said methods. The layer containing the light-sensitive metal oxide is provided, subsequent to the thermal treatment whilst a first resist mask is used, with resistors and/or conductor paths, after which the first resist mask is removed and the conductor paths or the resistors are applied with the use of a second resist mask.

Printed wiring panels with metallized holes are obtained by subjecting the panel to both sides of which is applied the adhesive layer containing the light-sensitive metal oxide, on a completely sensitized and/or activated substrate of the kind set forth, with the use of resist masks according to the negative of the desired patterns, selectively to the controlled action of a chemical roughening bath, by providing it subsequently with the required holes and subsequently, if desired after removal of the resist masks, by treating it with Pd(II)- or Pt(II)-ions by drying and exposing it, after which on the walls of the holes and on the catalyzed paths copper is grown by the electroless method, preferably also with the aid of the copper-plating bath defined above, and resist masks being subsequently removed, if desired.

Finally an additive method of producing electrically conductive metal patterns can be carried out, in which the layer containing the light-sensitive, semiconductor metal oxide is exposed in accordance with the desired pattern. For this purpose the layer is previously treated thermally, roughened superficially by the mild attack of a chemical roughening bath, treated with an aqueous solution of Pd(II)- or Pt(II)-ions, dried and exposed. The resultant metal nuclei image is intensified by means of applying an electroless copper- or nickel-plating bath to an electrically conductive metal layer.

Printed resistors may also be obtained by growing on the metal germ image the resistors to a thickness corresponding to a resistance value lying between 0.1 and 50 ohms/square with the aid of an electroless nickelplating bath depositing nickel having a comparatively high phosphorus content and a comparatively low temperature coefficient of the resistance. For making printed wirings the conductive paths are grown in a similar manner on the metal nuclei image to the desired thickness, the flexible copper being preferably deposited from the copper-plating bath described above.

Panels with printed wirings, in which printed resistors are integrated, may also be manufactured by exposing, subsequent to drying, the layer treated with a solution of Pd(II)-ions in accordance with the desired pattern and by growing the resistors by electroless nickel-plating, after which a resist mask in accordance with the negative of the wiring pattern is applied and a second treatment with Pd(II)-ions is carried out, the panel being subsequently dried and exposed uniformly, after which the conductive paths are grown to the desired thickness with the aid of an electroless copper-plating bath, preferably a bath depositing flexible copper as described above, after which the resist mask is removed, if desired. Also in this case plated-through holes can be made, for which purpose the thermally treated, superficially attacked layer containing the light-sensitive, semiconductor metal oxide and applied to both sides to a thoroughly sensitized and/or activated synthetic resin substrate of the kind described above is provided, together with said substrate, with the required holes, then treated with a solution of Pd(II)- or Pt(II)-ions, dried and subsequently exposed in accordance with the desired patterns, after which flexible copper is grown on the metal germs on the walls of the holes and on the catalyzed paths to the desired thickness with the aid of the preferred copper-plating bath described above.

In all these methods reference has been made several times to a resist mask. This mask may be applied by silk screening or photographically with the aid of a photolacquer, the resistance to the etchant of which is effected by exposure.

The rubbery components of the adhesive may include such substances as butadiene-styrene rubber, butadiene-acrylonitrile rubber, Butyl rubber, polychloroprene, chlorinated natural rubber and rubber. The thermosetting component of the adhesive may include such substances as the condensation product of bisphenol and epichlorohydrine with dicyandiamide or N,N-dimethylbenzylamine as a hardener, castor oil plasticized butylated phenolformaldehyde resins and alkaline cresol-formaldehyde resins.

All products obtained by these methods are preferably subjected to a curing process at a temperature between 135° C. and 165° C. for 10 to 30 minutes although higher temperatures at a longer period of time may be employed depending on the temperature resistance of the support and the adhesive layer.

In the following examples the method according to the invention will be explained more fully.

EXAMPLE I 16 panels of epoxyglass, after degreasing with trichloroethylene were divided into four series of four panels. All panels were provided with an 8 $\mu$m. thick, light-sensitive adhesive layer by pouring out a homogeneous dispersion of $TiO_2$ particles in a solution of a combination of 1 part by weight of a butadiene-acrylonitrile rubbery copolymer formed by the copolymerization of 66.7 parts of butadiene-1,3 and 33.3 parts of acrylonitrile, 1 part by weight of a thermosetting epoxy resin, the condensation product of bisphenol A and epichlorohydrin and 1/20 part by weight of a hardener, N,N-dimethylbenzylamine in methylethyl ketone. The ratio weight of $TiO_2$ and binder was chosen as follows:

light-sensitive adhesive 1:1 part by weight of $TiO_2$, 4 parts by weight of binder;
light-sensitive adhesive 2: 1 part by weight of $TiO_2$, 2 parts by weight of binder;
light-sensitive adhesive 3: 1 part by weight of $TiO_2$, 1 part by weight of binder;
light-sensitive adhesive 4: 2 parts by weight of $TiO_2$, 1 part by weight of binder.

The quantities of methylethylketone added to the adhesives 1 to 4 were chosen so that a 35% by weight solution of $TiO_2$ plus binder in methylethylketone was obtained.

Of the four series of epoxyglass panels series 1 was provided with the light-sensitive adhesive 1, series 2 with the light-sensitive adhesive 2, series 3 with the light-sensitive adhesive 3 and series 4 with the light-sensitive adhesive 4.

After the panels had been dried at 70° for 10 minutes, they were subjected to a thermal treatment carried out on all panels at 160° for 3 minutes.

Subsequently the light-sensitive adhesive layers of two panels of each series were superficially attacked by a chemical roughening bath (a) of the following composition:

100 mls. of concentrated $H_2SO_4$,
50 g. of concentrated $H_3PO_4$,
30 g. of $Na_2Cr_2O_7 \cdot 2H_2O$,
100 mls. of water;

the light-sensitive adhesive layer of the third panel of each series was superficially attacked by a roughening bath (b) of the following composition:

100 mls. of concentrated $H_2SO_4$,
50 g. of concentrated $H_3PO_4$,
15 g. of $Na_2Cr_2O_7 . 2H_2O$,
100 mls. of water.

The light-sensitive adhesive layer of the fourth panel of each series was superficially attacked by a roughening bath (c) of the following composition:

100 mls. of concentrated $H_2SO_4$,
50 g. of concentrated $H_3PO_4$,
7.5 g. of $Na_2Cr_2O_7.2H_2O$,
100 mls. of water.

The temperature of the roughening baths was in all cases 35° C. and the duration of the action on the light-sensitive adhesive layers was 1 minute. Under these conditions 0.2 to 0.5 $\mu$m. was etched away from the adhesive layers.

Subsequent to rinsing with water for 15 seconds, the panels were dipped for 10 seconds, for neutralizing purposes, in 0.5 mol NaOH. Then they were thoroughly rinsed for 1 minute with running water and dried.

Subsequently the panels were dipped for 1 minute in a solution containing 0.5 g. $PdCl_2$ and 5 mls. of concentrated HCl per litre of water.

After the panels had been dried in a vertical position, they were exposed uniformly for 20 seconds by means of a high-pressure mercury vapour discharge lamp of 125 w. (type HPR). The conversion of the light-reaction product of the exposure into Pd-nuclei was completed by rinsing with water for 30 seconds.

The Pd-nuclei formed were then intensified to a coherent, electrically conductive, flexible copper layer of a thickness of 3 $\mu$m. by treating the panels at 58° C. for 1.5 hours with a chemical copper-plating solution in water containing per litre:

0.028 mol. $CuSO_4 \cdot 5H_2O$,
0.030 mol. of tetra-Na-salt of ethylenediamine-tetraacetic acid,
0.10 mol. of NaOH,
0.13 mol. of formaldehyde and 0.1% by weight of Carbowax 4000 (a polyethylene oxide having a molecular weight of 3000 to 3700 from Union Carbide Chemicals Company).

Then all panels were provided, in accordance with the negative of the desired wiring pattern by screen printing, with an acid-resistant layer, after which the uncovered portions were intensified by electro-deposition with a current density of 3 a./dm.$^2$ to a thickness of about 30 $\mu$m. with copper with the aid of a bath being 1.5 N of copper sulphate and sulphuric acid. After the removal of the resist layer, the subjacent thin copper layer was removed by etching by means of a $FeCl_3$ solution in water.

Then the panels were subjected to subsequent curing. For all panels whose light-sensitive adhesive layer was superficially attacked by the roughening baths (b) and (c) and for one of the two panels of each series, whose light-sensitive adhesive layer had been treated with the roughening bath (a) said treatment was a heating process at 160° C. for 10 minutes, whereas for the other panels whose light-sensitive adhesive layer had been treated by the roughening bath (a) heating was carried out at 140° C. for 25 minutes.

All panels were subsequently subjected to an adhesion test, which consists of the determination of the stripping force of the copper patterns prior to and after dip soldering of the panels for 10 seconds at 250° C. In all cases the copper patterns were found to have a stripping force exceeding 130 g./mm. of conductor width.

An epoxyglass panel, subsequent to degreasing with trichloroethylene, was provided with the light-sensitive adheive 3, after which the method described above was carried out, the difference being, however, that the light-sensitive adhesive layer was attacked at 40° C. for one minute by a chemical roughening bath of the following composition:

100 mls. of concentrated $H_2SO_4$,
30 g. of concentrated $Na_2Cr_2O_7.2H_2O$,
150 mls. of water.

The resultant stripping force exceeded also in this case 130 g./mm. of track width both prior to and after dip soldering.

A further epoxyglass panel, subsequent to degreasing with trichloroethylene, was provided on both sides with the light-sensitive adhesive 4, after which by means of roughening bath (a) the two sides of the panel were covered with an electrically conductive, flexible copper layer by the method described above.

Subsequently the two sides of the panel were coated with an acid-resistant layer in accordance with the negative of the desired wiring patterns by silk screening, after which the panel was pierced at the desired places.

The walls of the holes were sensitized for the electroless metal plating by treating them in the conventional manner with an acidified solution containing palladium(II)-chloride and stannous-chloride (in stoichiometric excess) in water.

Subsequently, the walls of the holes were rendered electrically conductive with the aid of the chemical copper-plating solution described above, after which the walls of the holes and the uncovered portions of the panel surface were intensified to the desired thickness by electro-deposition.

Finally the covering layers and the subjacent thin copper layer were removed and the panel was subjected to the aforesaid aftercuring treatment at 160° C. for 10 minutes.

A further epoxyglass panel, subsequent to degreasing with trichloroethylene, was provided with the light-sensitive adhesive 3, dried and subjected to the thermal treatment, after which the light-sensitive adhesive layer was attacked superficially at 35° C. by a chemical roughening bath of type (a), by which already 1050 dm.$^2$ of light-sensitive adhesive layer per litre of roughening bath. After rinsing and neutralizing the panel was provided by the method described above with copper patterns. The stripping force measured in the adhesion test was higher than 130 g./mm. of track width both prior to and after dip soldering.

Epoxyglass panels, subsequent to degreasing with trichloroethylene, were provided photochemically with electrically conductive copper patterns, whilst in one of the following manners the method according to the invention was deviated from:

(1) An epoxyglass panel was provided with a light-sensitive adhesive layer of conventional thickness by pouring out a homogeneous dispersion of $TiO_2$ particles in a solution of a combination of 1 part by weight of a rubber-like butadiene-acrylonitrile copolymer, 1 part by weight of a rubber-like butadiene-acrylonitrile copolymer, 1 part by weight of a thermohardening epoxyresin and 1/20 part by weight of a polyamine hardener, the difference being that the ratio between the weights of $TiO_2$ and binder was 8:1. Owing to the high quantity of $TiO_2$ in the adhesive layer the adhesion of the copper patterns to the basic layer was found not to satisfy the requirement of 100 g./mm. of conductor width of stripping force.

(2) A light-sensitive adhesive layer applied to an epoxyglass panel by pouring out a light-sensitive adhesive 4, subsequent to drying, was attacked without being subjected to the thermal treatment, at 35° C. for 1 minute by the chemical roughening bath (a) and provided with copper patterns by the method described above. Also in this case the stripping force was found to be below 100 g./mm. of conductor width.

(3) An 8 $\mu$m. light-sensitive adhesive layer applied to an epoxyglass panel by pouring out the light-sensitive adhesive 4, subsequent to conventional drying and thermal treatment, was attacked at 50° C. for 4 minutes by the chemical roughening bath (a) so that about 4 $\mu$m. of the adhesive layer was etched away. The stripping force of the copper patterns applied to the roughened adhesive layer was found to be only about 60 g./mm. of conductor width.

(4) After having been dried and thermally treated an adhesive layer applied to an epoxyglass panel by pouring out the light-sensitive adhesive 4 was provided with palladium (II)-ions and subsequently processed without having been subjected to the attack by a chemical roughening bath. The $TiO_2$ particles at the surface of the light-sensitive adhesive were found to be screened off by the hydrophobic binder to an extent such that no coherent, electrically conductive copper layer could be obtained.

EXAMPLE II

Of three epoxyglass panels, subsequent to degreasing by trichloroethylene, each one was provided with an 8 μm.-thick light-sensitive adhesive layer by pulling it up from one of the following light-sensitive adhesives.

(1) A homogeneous dispersion of 2 parts by weight of $TiO_2$ in a solution of 1 part by weight of a resin combination consisting of 1 part of an epoxyresin and 2 parts by weight of a butadiene-acrylonitrile copolymer in methylethylketone, to which were added the 60 parts by weight of the resin combination and 1 part by weight of the polyamide hardener.

(2) A homogeneous dispersion of 2 parts by weight of $TiO_2$ in a solution of 1 part by weight of a resin combination consisting of 2 parts by weight of an epoxyresin and 1 part by weight of a butadiene-acrylonitrile copolymer in methylethylketone, to which was added 1 part by weight of a polyamine hardener per 30 parts by weight of the resin combination.

(3) A homogeneous dispersion of 2 parts by weight of $TiO_2$ in a solution of a resin combination consisting of 1 part by weight of a butadiene-acrylonitrile copolymer and 1 part by weight of an alkaline cresol resin in methylethylketone. The quantities of methylethylketone added to the light-sensitive adhesives 1 to 3 were chosen so that a 35% by weight solution of $TiO_2$ plus binder was obtained in methylethylketone.

After drying at 70° C. for 10 minutes the three panels were provided with copper patterns of a thickness of about 30 μm. by the method described in Example I, the light-sensitive adhesive layer being superficially attacked by the chemical roughening bath (b) and subsequent curing being carried out at 160° C. for 10 minutes.

The resultant products were subsequently subjected to the adhesion test described in Example I and in all cases, both prior to and after dip soldering stripping forces exceeding 125 g./mm. of conductor width were measured.

EXAMPLE III

In a machine for the continuous production of electrically conductive metal patterns on an uninterrupted film of flexible basic material a polyimide film of a width of 30 cms. and a thickness of 50 μm. was provided with an 8 μm. thick, light-sensitive adhesive layer by applying the light-sensitive adhesive 4 described in Example I with the aid of a casting slot.

After drying at 80° C. the film was exposed for 3 minutes to a thermal treatment by passing it through a furnace at 160° C.

Subsequently, the light-sensitive adhesive layer was superficially chemically attacked by passing the continuously moving film through a roughening bath of the type (a) of Example I at a temperature of 35° C. (contact time 1 minute), after which the film was rinsed with water.

Then the light-sensitive side of the film was wetted by means of a roller with a 0.5 molar NaOH solution, after which it was thoroughly washed with running water for 30 seconds.

After drying at 80° C. the light-sensitive adhesive layer was provided with Pd(II)-ions by applying, also with the aid of a roller, a solution of 0.5 g. of $PdCl_2$ and 5 mls. of concentrated HCl per litre of water.

Then the film was again dried and exposed across the negative of the wiring pattern for 15 seconds to a 125 w. HPR lamp, after which the conversion of the light-reaction product resulting from the exposure into an image consisting of Pd-nuclei was accomplished and the palladium salt retained by the layer at the unexposed places was removed by washing with water for 30 seconds.

The resultant image consisting of palladium nuclei was subsequently intensified to an electrically conductive copper pattern by providing the film side coated with the light-sensitive adhesive by means of a casting slot with a layer of chemical copper-plating solution, which had been prepared by mixing, a short time prior to the application to the film, 5 parts by volume of a solution containing per litre of water 0.15 mol of $CuSO_4 \cdot 5H_2O$,
0.34 mol of tetra-Na-salt of ethylenediaminetetra-acetic acid and
0.7 mol of NaOH with 1 part by volume of a 35% formaldehyde solution, said layer being subsequently allowed at room temperature to affect for one and a half hours the palladium nuclei image, while the moving film covered a horizontal path of 3 metres.

Then the exhausted copper-plating solution was removed by washing with water and the film was dried, after which the conductive copper patterns were intensified by electrodeposition to a thickness of 20 μm. in a continuous process. After subsequent curing at 160° C. for 10 minutes the resultant products were subjected to said adhesion test, and both prior to and after dip soldering stripping-off forces exceeding 110 g./mm. of conductor width were measured.

EXAMPLE IV

A panel of epoxyglass, subsequent to degreasing by trichloroethylene, was provided with an 8 μm. thick, light-sensitive adhesive layer by pulling it up from the light-sensitive adhesive 4 of Example I. After drying at 70° C. for 10 minutes the thermal treatment, the superficial attack of the light-sensitive layer by a chemical roughening bath (a), the NaOH-treatment and the application of the $Pd(II)^+$-ions were carried out as described in Example I.

Subsequently the panel was exposed across the negative of a resistance pattern for 30 seconds to a 125 w. HPR lamp, after which the conversion of the light-reaction product resulting from the exposure into an image consisting of palladium nuclei was completed and the palladium salt retained by the layer at the unexposed areas was removed by washing with water for 30 seconds.

The resultant image consisting of palladium nuclei was subsequently intensified to a resistance pattern having a resistance value of 30 ohms/square and a temperature coefficient of $-20 \cdot 10^{-6}$/° C. by treating it for 10 minutes at 95° C. with a chemical nickel-plating solution in water containing per litre:

30 g. of nickelchloride ($NiCl_2 \cdot 6H_2O$),
10 g. of sodium hypophosphite ($NaH_2PO \cdot H_2O$) and
25 g. of 70% technical glycollic acid, after which the resistors formed were stabilized with respect to variation of the resistance value with time by heating the panel for two hours at 200° C.

For the manufacture of a panel with printed wirings, in which printed resistors were integrated, an epoxyglass plate was provided both on the resistor and conductor places by the method described above with a combined pattern. Then the resistor portion was covered and the conductor pattern was grown on the uncoated nickel to the desired thickness of flexible copper with the aid of the chemical copper-plating solution of Example I.

EXAMPLE V

In this example a completely sensitized or activated basic material was used.

For the manufacture of the completely sensitized basic material the following method was used:

(1a) 10 g. of zirconium oxide hydrate (200 U.S. Mesh, Bio-Rad HZO–1) was shaken with 1 litre of charging solution (10% by weight of neutral solution of sodium dithionite) under exclusion of air up to equilibrium, filtered off, washed with oxygen-free, deionized water and dried in vacuo. The sensitized filler was then finely divided in 100 g. of a phenolic resin or an epoxy resin for the manufacture of laminates of hard paper or epoxyglass.

(1b) Instead of a charging solution of sodium dithionite, a solution of sodium hypophosphite was used.

(1c) Instead of birconium oxide hydrate titanium oxide hydrate (Bio-Rad HTO–1) was used.

(2) 10 g. of "Ag1–X8 anion exchange resin," (400 U.S. Mesh), a styrene-divinylbenzene polymer containing quaternary ammonium groups of Bio-Rad Laboratories, having an exchange capacity of 3.2 meq./g. was shaken in the $OH^-$ form with 70 mls. of a 10% by weight solution of sodium borohydride (sodium boranate) under exclusion of air at a low temperature until the exchange equilibrium had been adjusted. After washing with oxygen-free, deionized water and drying in vacuo the resultant redox resin was introduced into the phenolic resin for the manufacture of a hard-paper laminate, the ratio by weight between redox resin and phenolic resin being 1:10.

(3) The aforesaid anion exchanger in the chloride form was charged in a similar manner with complex-bonded $SnCl_2$ by treating it with 100 mls. of an aqueous solution containing 10 g. of stannous chloride and being 4-normal in hydrochloric acid. The redox resin was distributed in the phenolic resin.

EXAMPLE VI

For the manufacture of a thoroughly activated base material the following method was carried out: 50 g. of $TiO_2$ was suspended in 100 mls. of a 0.3% by weight solution of $PdCl_2$ in water, containing, in addition, 30 mls. of concentrated HCl per litre of water. The suspension was exposed for a few hours in a photo chemical reactor, comprising a few luminescent lamps of the so-called "black light" type. The suspension was constantly pumped around. Then it was filtered off, washed with de-ionized water until chloride free and dried at 110° C. The ground material was subsequently distributed in a phenolic resin or an epoxy resin for the manufacture of laminates on the basis of hard paper or epoxy-glass in the ratio of 8 parts of filler to 100 parts of resin.

The resultant activated $TiO_2$ filler has better catalytic properties for the electroless metallization of $TiO_2$ obtained by the chemical reduction of palladium(II)-ions in the suspension.

EXAMPLE VII

An epoxyglass panel, which had been sensitized throughout the bulk by the method mentioned under 1a of Example V with the aid of a solution of sodium dithionite, was provided, subsequent to degreasing by trichloroethylene, on both sides with an 8 μm. thick, light-sensitive adhesive layer by pulling it up from the light-sensitive adhesive 4 of Example I. After drying for 10 minutes at 70° C. the thermal treatment, the superficial attack of the light-sensitive layer by a chemical roughening bath of thte type (b) and the NaOH treatment were carried out in accordance with the method described in Example I.

After washing and drying the two sides of the panel were provided with a uniform photo-lacquer layer of about 5 μm. thick by using the positive photo-lacquer marketed under the trade name of AZ–340 by Shipley Company. Subsequently the panel was dried at 70° C. for 15 minutes, after which the photo-lacquer layers on both sides were exposed across negatives of the desired wiring patterns. At the exposed areas the photo-lacquer was removed by means of AZ-developer 303 (Shipley). After washing and drying the photo-lacquer layers were heated at 140° C. for 10 minutes, after which the desired holes were pierced in the panel.

The panel was subsequently dipped for 1 minute in a solution containing 0.5 g. $PdCl_2$ and 5 mls. of concentrated HCl per litre of water and dried. Owing to the presence of exposed reducing groups palladium nuclei were formed on the walls of the holes by the reduction of $Pd(II)^+$ ions. The introduction of palladium nuclei on the surface portions not covered by photo-lacquer was carried out by uniform exposure and washing with water. The palladium nuclei on the walls of the holes and on both sides of the panel were subsequently intensified to electrically conductive, flexible copper patterns of a thickness of 25 μm. by treating for 13 hours with the chemical copper-plating solution of Example I, after which the photo-lacquer still present was removed. After the subsequent curing at 160° C. for 10 minutes the panel was subjected to the adhesion test described in Example I, stripping forces being measured both prior to and after dip soldering of more than 125 g./mm. of conductor width.

Corresponding results can be obtained by using, instead of the aforesaid base material, a completely sensitized or activated base material produced by one of the other methods described.

EXAMPLE VIII

An epoxyglass panel, subsequent to degreasing by trichloroethylene, was provided with an 8 μm. thick adhesive layer by pouring out the light-sensitive adhesive 3 of Example I. After drying at 70° C. for 10 minutes the panel was subjected to the thermal treatment at 160° C. for 3 minutes.

The panel was then provided by the method of Example V in accordance with the negative of the desired wiring pattern with a positive-action photo-lacquer of the type AX–340, which is acid-resistant, of about 2 μm. thick. Then the non-covered portions of the light-sensitive adhesive layer were attacked superficially in the manner described in Example I by means of a chemical roughening bath of type (a). After washing with water for 15 seconds the panel was dipped for 10 seconds in 0.1 molar NaOH, washed thoroughly with running water for 1 minute, and dried.

Subsequently the panel was dipped for one minute in a solution containing 0.5 g. of $PdCl_2$ and 5 mls. of concentrated HCl per litre of water, after which the palladium nuclei were introduced at the areas of the light-sensitive adhesive layer not covered by photo-lacquer by means of light in the manner described in Example I. After the residual photo-lacquer had been removed, the resultant palladium nuclei were intensified to electrically conductive, flexible copper patterns of a thickness of 25 μm. by treating them for 13 hours with a chemical copper-plating solution of Example I. Finally the panel was subjected to subsequent curing at 160° C. for 10 minutes and both prior to and after dip soldering the panel exhibited a stripping-off force exceeding 125 g./mm. of conductor width.

The method described in this example may also be carried out without the need for further means for the manufacture of panels provided on both sides with wirings and having plated-through holes, by starting from a completely sensitized or activated basic material manufactured by one of the methods of Example V.

What is claimed is:

1. A photochemical method of producing an electrically conductive metal layer on at least part of a substrate, said method comprising forming a 5 to 20 μm. thick light-sensitive adhesive layer on a substrate, said adhesive layer consisting of an insulatng, predominantly hydrophobic, resinous binder in which there is homogeneously dispersed finely divided particles of a light-sensitve semiconductor metal oxide capable of precipitating out copper and metals more noble than copper from a solution of the salt thereof, the binder in said adhesive layer containing thermohardening constituents and rubbery constituents in a ratio by weight lying between 4:1 and 1:4 and the binder to light-sensitive metal oxide ratio being between 8:1 and 1:4, subjecting said light-sensitive adhesive layer to a thermal treatment at a temperature between 130° C. and 200° C. for a period of from 2 to 15 minutes, then applying a chemical etch to said light sensitive adhesive layer in a manner such that a thickness of about 0.1 $\mu$m. to 1 $\mu$m. of the adhesive layer is removed leaving uncovered light-sensitive semiconductor metal oxide particles, treating said light-sensitive adhesive layer with a metal salt solution capable, upon exposure to actinic light, of producing metal nuclei at the exposed areas, exposing at least part of said metal salt solution treated adhesive layer to the action of actinic light, treating said adhesive layer with a bath capable of chemically depositing metal selected from the group consisting of copper, nickel and cobalt on said metal nuclei and then subjecting said thus formed object to a subsequent heat curing at a temperature of between 135° C. and 165° C. for about 10 to 30 minutes.

2. The method of claim 1 wherein the light-sensitive adhesive layer contains dispersed particles of $TiO_2$ or ZnO.

3. The method of claim 2 wherein the chemical etch is a solution of sulfuric acid, sodium bichromate and phosphoric acid.

4. The method of claim 1 wherein the layer containing the semiconductor metal oxide is applied to a synthetic resin substrate which is uniformly sensitized and/or activated throughout its bulk for metallization with the aid of a physical developer or with the aid of an electroless copper-, nickel- and/or cobalt-plating bath.

5. The method of claim 4, wherein the synthetic resin substrate contains a homogeneously distributed redox polymer which is capable of separating out the metal from copper ions and/or ions of a metal nobler than copper.

6. The method of claim 4, wherein the synthetic resin substrate contains a finely divided, inorganic or organic redox ion exchanger, said ion exchanger being charged with anions or cations which are capable of separating out the metal from copper ions and/or ions of a metal nobler than copper.

7. The method of claim 4, wherein the synthetic resin substrate contains a uniformly, finely divided, light-sensitive metal oxide, the separate particles of which are superficially provided by the action of light with metal nuclei, which operate as a catalyst for chemical metallization.

8. The method of claim 2 wherein the metal salt solution is a solution containing Pd(II) or Pt(II) ions in a concentration lying between 0.0005 and 0.25% by weight and the bath capable of chemically depositing metal is an electroless copper or nickel-plating bath.

9. The method of claim 1 wherein, prior to the final curing step, additional metal is applied to the metallized area by electrodeposition.

10. The method of claim 1 wherein the layer containing the semi-conductor metal oxide is applied to both sides of the synthetic resin substrate.

11. A method of manufacturing printed wirings with completely metallized holes, said method comprising forming a 5 to 20 $\mu$m. thick light-sensitive adhesive layer on both sides of a substrate, said adhesive layers consisting of an insulating, predominantly hydrophobic, resinous binder in which there is homogeneously dispersed finely divided particles of a light-sensitive semiconductor metal oxide capable of precipitating out copper and metals more noble than copper from a solution of the salt thereof, the binder in said adhesive layer containing thermo-hardening constituents and rubbery constituents in a ratio by weight lying between 4:1 and 1:4 and the binder to light-sensitive metal oxide ratio being between 8:1 and 1:4, subjecting said light-sensitive adhesive layer to a thermal treatment at a temperature between 130° C. and 200° C. for a period of from 2 to 15 minutes then applying a chemical etch to said light-sensitive adhesive layer in a manner such that a thickness of about 0.1 $\mu$m. to 1 $\mu$m. of the adhesive layer is removed leaving uncovered light-sensitive semiconductor metal oxide particles, applying to both of said thermally treated, superficially attached adhesive layers, resist masks according to the negative of the desired pattern, piercing the resultant masked panel in order to provide the required holes, treating the thus apertured masked panel with a solution containing a metal ion selected from the group consisting of Pd(II) or Pt(II) in a concentration of 0.005 to 0.25% by weight, drying the masked panel, exposing the thus dried masked panel to the action of actinic light to thereby provide metal nuclei at the exposed areas, treating said masked panel with an electroless copper-plating bath to provide a layer of flexible copper of the desired thickness, removing the resist masks and then subjecting said panel to a heat curing at a temperature of between about 135° C. and 165° C. for about 10 to 30 minutes.

References Cited

UNITED STATES PATENTS

| | | | |
|---|---|---|---|
| 3,616,294 | 10/1971 | Kheighatian et al. | 156—2 X |
| 3,627,576 | 12/1971 | Knorre et al. | 156—2 X |

FOREIGN PATENTS

| | | | |
|---|---|---|---|
| 1,187,061 | 4/1970 | Great Britain | 117—212 |

OTHER REFERENCES

Jonker, H., et al.: Physical Development Recording Systems: IV—PD, Photoplating, P.S. & E., vol. 13, No. 2, March–April 1969, only pp. 46, 47, 48.

DAVID KLEIN, Primary Examiner

U.S. Cl. X.R.

96—36.2, 48 PD; 117—212; 156—2